United States Patent
Singh

(10) Patent No.: US 9,543,378 B2
(45) Date of Patent: Jan. 10, 2017

(54) SEMICONDUCTOR DEVICES AND FABRICATION METHODS THEREOF

(71) Applicant: GLOBALFOUNDRIES Inc., Grand Cayman (KY)

(72) Inventor: Jagar Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 10 days.

(21) Appl. No.: 14/467,420

(22) Filed: Aug. 25, 2014

(65) Prior Publication Data

US 2016/0056231 A1 Feb. 25, 2016

(51) Int. Cl.

| | | |
|---|---|---|
| *H01L 29/06* | (2006.01) | |
| *H01L 29/66* | (2006.01) | |
| *H01L 29/735* | (2006.01) | |
| *H01L 29/417* | (2006.01) | |
| *H01L 29/423* | (2006.01) | |
| *H01L 29/08* | (2006.01) | |
| *H01L 29/10* | (2006.01) | |

(52) U.S. Cl.
CPC ....... *H01L 29/0619* (2013.01); *H01L 29/0692* (2013.01); *H01L 29/0821* (2013.01); *H01L 29/1008* (2013.01); *H01L 29/41708* (2013.01); *H01L 29/42304* (2013.01); *H01L 29/6625* (2013.01); *H01L 29/735* (2013.01)

(58) Field of Classification Search
CPC .................................................... H01L 29/0619
USPC ........................................ 257/25, 347, 402
See application file for complete search history.

(56) References Cited

U.S. PATENT DOCUMENTS

| | | | | |
|---|---|---|---|---|
| 4,940,671 A | * | 7/1990 | Small ................ | H01L 21/82285 257/491 |
| 8,610,241 B1 | * | 12/2013 | Hu ....................... | H01L 27/0629 257/353 |
| 2004/0095698 A1 | * | 5/2004 | Gerrish ............... | H01L 27/0255 361/91.1 |
| 2004/0253779 A1 | * | 12/2004 | Hong .................. | H01L 21/8249 438/203 |

* cited by examiner

*Primary Examiner* — Kenneth Parker
*Assistant Examiner* — Warren H Kilpatrick
(74) *Attorney, Agent, or Firm* — Heslin Rothenberg Farley & Mesiti P.C.; Kristian E. Ziegler

(57) ABSTRACT

Semiconductor devices and fabrication methods thereof are provided. The semiconductor devices include: a substrate, the substrate including a p-type well adjoining an n-type well; a first p-type region and a first n-type region disposed within the n-type well of the substrate, where the first p-type region at least partially encircles the first n-type region; and a second p-type region and a second n-type region disposed in the p-type well of the substrate, where the second n-type region at least partially encircles the second p-type region. In one embodiment, the first p-type region fully encircles the first n-type region and the second n-type region fully encircles the second p-type region. In another embodiment, the semiconductor device may be a bipolar junction transistor or a rectifier.

19 Claims, 5 Drawing Sheets

SEMICONDUCTOR DEVICES AND FABRICATION METHODS THEREOF

FIELD OF THE INVENTION

The present invention relates to semiconductor devices and methods of fabricating semiconductor devices.

BACKGROUND OF THE INVENTION

Modern integrated circuit designs may include a variety of different semiconductor device types optimized for different functions. For example, field-effect transistors are widely used to provide digital functions, such as logic, memory, or processing. Other types of semiconductor devices, such as bipolar junction transistors and rectifiers, are desirable to provide analog functions, such as temperature detection, electrostatic discharge protection, amplification, or radio frequency functions. Therefore, integrated circuits combining these different types of semiconductor devices to provide both analog and digital functions are desirable. However, different device architectures of, for example, field-effect transistors and bipolar junction transistors, typically require separate fabrication processes, leading to increased complexity and cost.

BRIEF SUMMARY

The shortcomings of the prior art are overcome, and additional advantages are provided, through the provision, in one aspect, of a semiconductor device. The semiconductor device includes: a substrate, the substrate including a p-type well adjoining an n-type well; a first p-type region and a first n-type region disposed within the n-type well of the substrate, where the first p-type region at least partially encircles the first n-type region; and a second p-type region and a second n-type region disposed in the p-type well of the substrate, where the second n-type region at least partially encircles the second p-type region.

In another aspect, a method is presented. The method includes providing a semiconductor device including a substrate, the substrate including a p-type well adjoining to an n-type well. The providing includes: fabricating a first p-type region and a first n-type region disposed within the n-type well of the substrate, and a second p-type region and a second n-type region disposed within the p-type well of the substrate, where the first p-type region at least partially encircles the first n-type region, and the second n-type region at least partially encircles the second p-type region.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 1B is a cross-sectional elevational view of the structure of

FIG. 1A, taken along line 1B-1B thereof, in accordance with one or more aspects of the present invention;

FIG. 1D is a cross-sectional elevational view of the structure of

FIG. 1C, taken along line 1D-1D thereof, in accordance with one or more aspects of the present invention;

DETAILED DESCRIPTION

Figure 1A:
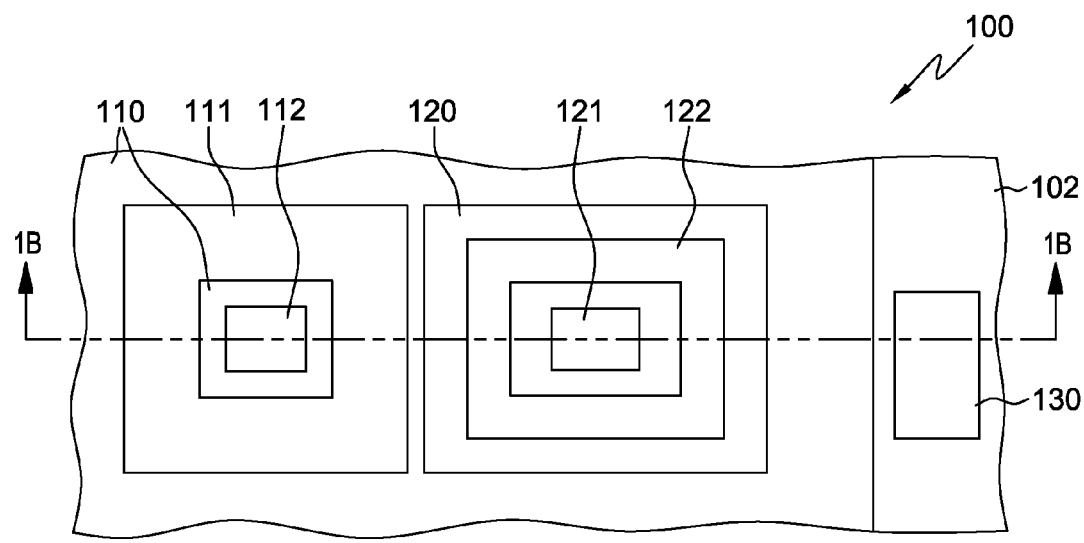
FIG. 1A is a plan view of one embodiment of a structure including a semiconductor device, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

In one implementation, an integrated circuit design may include multiple different device types at different locations to perform different functions. During integrated circuit and semiconductor fabrication processing, millions, billions or more devices of these devices, such as transistors, capacitors, rectifiers, and resistors, may be formed to enable logic circuits, memory storage elements, or analog components. The semiconductor fabrication process is very complex, and techniques that tend to reduce complexity can improve yield and reduce costs. Cost reductions may be achieved by, for example, the elimination or consolidation of process steps, or the simplification of designs.

For example, as described herein, several advantages may be realized by defining a single universal device design that may be adapted to act as multiple different device types, leading to reduced design and maintenance costs. For instance, a universal design layout for multiple semiconductor devices may be developed to enable multiple different devices. Initially, during an early fabrication stage, this universal design layout may be repeatedly patterned and formed onto, for example, a substrate. Later, in a subsequent fabrication stage, different conductive connections, such as metal lines and interconnects, may be added so that different instantiations of the universal design layout act as multiple different device types. Further, during operation, different bias voltages may be applied to different terminals of different devices, as needed to enable operation.

In addition, some of the required devices on an integrated circuit may be field-effect transistors, and others may be bipolar junction transistors. In such a case, a technique that allows both different types of transistors to be compatibly fabricated using common processing steps, such as masking, patterning, and etching, can significantly reduce costs.

Generally stated, provided herein, in one aspect, is a semiconductor device. The semiconductor device includes: a substrate, the substrate including a p-type well adjoining an n-type well; a first p-type region and a first n-type region disposed within the n-type well of the substrate, where the first p-type region at least partially encircles the first n-type region; and a second p-type region and a second n-type region disposed in the p-type well of the substrate, where the second n-type region at least partially encircles the second p-type region. In one example, the first p-type region fully encircles the first n-type region within the n-type well and the second n-type region fully encircles the second p-type region within the p-type well. In another example, one of the p-type well or the n-type well of the substrate is located within the other of the p-type well or the n-type well of the substrate. In a further example, the structure further includes a p-type substrate contact region, where the p-type substrate contact region is spaced apart from both the p-type well and the n-type well, and electrically contacts the substrate.

In one implementation, the semiconductor device includes a bipolar junction transistor, the bipolar junction transistor including: a base region and an emitter region, the base region including one of the first n-type region or the second p-type region and the emitter region including the other of the first n-type region or the second p-type region; and a collector region and a ring region, the collector region including one of the first p-type region or the second n-type region and the ring region including the other of the first p-type region or the second n-type region. In such an implementation, in one example, the electrical contact structure electrically connects the ring region and the emitter region. In another example, the ring region encircles the emitter region. In a further example, the ring region is configured to facilitate linearity of the bipolar junction transistor.

In another implementation, the semiconductor device includes a semiconductor controlled rectifier, the semiconductor controlled rectifier including: an anode, the anode including one of the first p-type region or second p-type region; a first section, the first section including the first p-type region; a second section, the second section including the first n-type region; a third section, the third section including the second n-type region; and a fourth section, the fourth section including the second p-type region.

In a further implementation, the substrate includes a first semiconductor material, and at least one region of the first p-type region, first n-type region, second p-type region, or second n-type region includes a second semiconductor material, where the first and second semiconductor materials are different semiconductor materials. In such an implementation, in one example, the first semiconductor material includes silicon and the second semiconductor material includes silicon germanium. In another example, the second semiconductor material of the at least one region is in at least partial crystal alignment with the first semiconductor material of the first substrate.

In one embodiment, the substrate includes multiple fins, and at least one region of the first p-type region, first n-type region, second p-type region, or second n-type region includes one or more fins of the multiple fins of the substrate. In such a case, the structure may further include at least one epitaxial contact structure, the at least one epitaxial contact structure contacting the one or more fins of the at least one region.

In another aspect, a method is presented. The method includes providing a semiconductor device including a substrate, the substrate including a p-type well adjoining to an n-type well. The providing includes: fabricating a first p-type region and a first n-type region disposed within the n-type well of the substrate, and a second p-type region and a second n-type region disposed within the p-type well of the substrate, where the first p-type region at least partially encircles the first n-type region, and the second n-type region at least partially encircles the second p-type region. In one example, the fabricating further includes forming the first p-type region to fully encircle the first n-type region within the n-type well and the second n-type region to fully encircle the second p-type region within the p-type well.

In one embodiment, the providing further includes: forming one well of the p-type well or the n-type well within the substrate; and forming the other well of the p-type well or the n-type well within the one well.

In another embodiment, the substrate includes a first semiconductor material, and the fabricating includes: forming at least one region of the first p-type region, first n-type region, second p-type region, or second n-type region with a second semiconductor material, wherein the first and second semiconductor materials are different semiconductor materials. In such a case, the forming may include: providing at least one cavity in the substrate; and epitaxially growing the second semiconductor material from one or more surfaces of the at least one cavity to form the at least one region.

In a further embodiment, the method further includes forming, before the fabricating, multiple fins extending from the substrate, wherein the fabricating includes fabricating at least one region of the first p-type region, first n-type region, second p-type region, or second n-type region to include one or more fins of the multiple fins of the substrate.

Reference is made below to the drawings, which are not drawn to scale for ease of understanding, wherein the same reference numbers used throughout different figures designate the same or similar components.

FIG. 1A is a plan view of one embodiment of a structure 100 including a semiconductor device, in accordance with one or more aspects of the present invention. Regarding terminology used herein, various different regions of structure 100 may have different conductivity types, and may be intrinsic, p-type, or n-type semiconductor regions. For instance, n-type regions may include semiconductors doped with phosphorous, arsenic, or any other donor atoms, p-type regions may include semiconductors doped with boron, aluminum, or any other acceptor atoms. In addition, regions with greater doping concentrations may be denoted as p+-type or n+-type regions. Some doped regions may be referred to as wells, which may have other doped regions therein. Further, devices having one or more such regions may be referred to as PNP, NPN, NPNP, or PNPN devices, depending on the configuration of the p-type and n-type regions thereof.

With reference to FIG. 1A, structure 100 is a multi-use, or universal, device structure, which may be used as an NPN bipolar junction transistor (BJT), a PNP bipolar junction transistor, and/or a semiconductor controlled rectifier, depending on how it is electrically connected and/or biased after formation. In the illustrated embodiment, structure 100 includes a substrate 102, which has a p-type well 120 adjoining an n-type well 110. In this embodiment, p-type well 120 is located within n-type well 110. In different examples, an n-type well may be located within a p-type well, or the wells may be located adjacent to one another on the substrate. As illustrated, the boundary between p-type well 120 and n-type well 110 defines a so-called p-n junction of structure 100. The presence and configuration of the p-n junction influences the electrical properties of the device.

Continuing with the illustrated embodiment, structure 100 includes a first p-type region 111 and a first n-type region 112 disposed within n-type well 110, and first p-type region 111 at least partially encircles first n-type region 112. Similarly, and in a symmetric configuration, structure 100 also includes a second p-type region 121 and a second n-type region 122, and second n-type region 122 at least partially encircles second p-type region 121.

The encircling region (for example, first p-type region 111 or second n-type region 122) surrounds and forms a full or partial border, or ring region, around a surrounded region (for example, first n-type region 112 or second p-type region 121), in at least two dimensions. As shown, first p-type region 111 fully encircles first n-type region 112 within n-type well 110, and second n-type region 122 fully encircles second p-type region 121 within p-type well 120. In other examples, the encircling region may at least partially surround another region in three-dimensions, similarly to how the outside surface of a sphere surrounds the inner volume thereof.

Structure 100 further includes a substrate contact region 130, which is spaced apart from both p-type well 120 and n-type well 110. Substrate contact region 130 may be p-type or n-type doped in different examples, and may be used to enable a low resistance contact to the substrate, which may be grounded.

During semiconductor fabrication processing, numerous identical structures may be formed simultaneously over a single semiconductor wafer. The initially identical structures may be later connected in different ways to be different semiconductor device types.

In one example substrate 102 may be or include any silicon-containing substrate material including, but not limited to, single crystal Si, polycrystalline Si, amorphous Si, Si-on-nothing (SON), Si-on-insulator (SOI), or Si-on-replacement insulator (SRI) substrates. In other examples, the substrate may be or include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof, or an alloy semiconductor such as GaAsP, AlInAs, GaInAs, GaInP, or GaInAsP or combinations thereof. In further examples, the substrate may be an n-type or p-type doped semiconductor material.

Figure 1B:
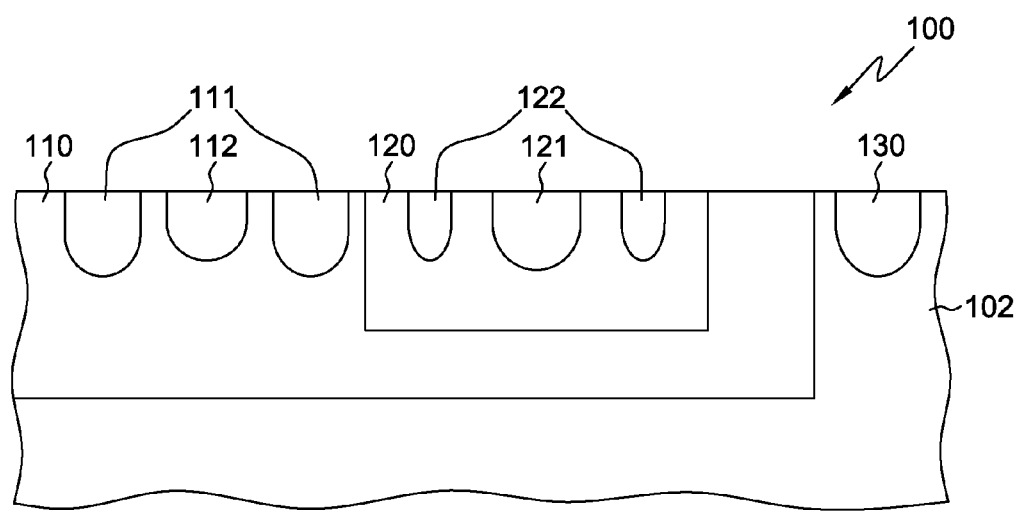

FIG. 1B is a cross-sectional elevational view of structure 100, taken along line 1B-1B of FIG. 1A, in accordance with one or more aspects of the present invention.

Different regions, such as first p-type region 111 or second n-type region 122 may have uniform or varying depths, and may or may not be deeper than a depth of the surrounded region, for example, first n-type region 112 or second p-type region 121.

In one example, substrate 102 includes a first semiconductor material, such as single crystal silicon, which may be, for example, an intrinsic or un-doped semiconductor material. In such an example, the various p-type and n-type regions include doped regions of the uniform substrate. In order to form the various depicted p-type and n-type regions p-type or n-type dopants may be implanted into the substrate. For example, ion implantation may be used to introduce boron or phosphorous into the substrate to form p-type or n-type regions.

In another example, forming a doped region may include forming at least one cavity in the substrate, and growing a second semiconductor material from one or more surfaces of the at least one cavity to form the doped region.

For example, a cavity may be formed by etching the substrate using one or more steps of isotropic or anisotropic etching, including reactive ion etching (RIE) or plasma etching, using process parameters tuned to yield a desired cavity shape profile. As illustrated, the cavity shape profile may be U-shaped. In other examples, the cavity may be at least partially sigma shaped, having one or more angular faces, following crystallographic planes of the substrate, such as <110>, <111>, and/or <100> planes.

After cavity formation, the second semiconductor material may be deposited through, for example, epitaxial growth, which refers to the orderly growth of crystalline material from one or more surfaces of the cavity, in at least partial crystallographic alignment with the underlying surface. The second semiconductor material could be doped as it is deposited or grown (for example, using in situ doping), or could be doped after deposition. The second semiconductor material grown within the cavity may be either n-type or p-type doped, depending on whether an n-type or p-type region is desired, using n-type or p-type dopants as described above with reference to FIG. 1A. For example, epitaxial silicon germanium may be grown within a cavity of a silicon substrate. Because the lattice constant of silicon germanium is greater than that of silicon, such a configuration may be desirable to introduce strains in the substrate, which can improve the mobility of charge carriers therein.

In another embodiment, a combination of doping and epitaxial growth could be employed. For example, a deep n-well could be formed by doping a substrate, and then a shallower p-well could be formed in the deep n-well. A cavity could be formed in the p-well, and an epitaxial p-type region could be grown within the cavity. In such an example, there would be a p-n junction between the deep n-well and the shallower n-well, and the junction would not be located directly at the boundary of the cavity. By comparison, an epitaxial p-type region formed directly in an n-well would have a p-n junction located directly at the boundary of the cavity. Having the p-n junction located at the boundary of the cavity could lead to performance issues due to defects located at the cavity boundary, and bandgap lowering if the epitaxial material has a different bandgap than the substrate, which would be the case for silicon germanium epitaxial material within a silicon substrate. Such issues would not be present if the p-n junction were between the n-well and the p-well. Thus, the configuration described could lead to improved device performance, such as improved linearity and reduced variability from one device to the next. As used herein, linearity of the transistor refers to the ability of the transistor to retain the same device characteristics notwithstanding changes in external conditions, including, for example, increases in temperature. Advantageously, the present technique allows formation of a good quality p-n junction, allowing controlled spatial uniformity and dopant depth profile, leading to lower leakage current and higher breakdown voltage.

Figure 1C:
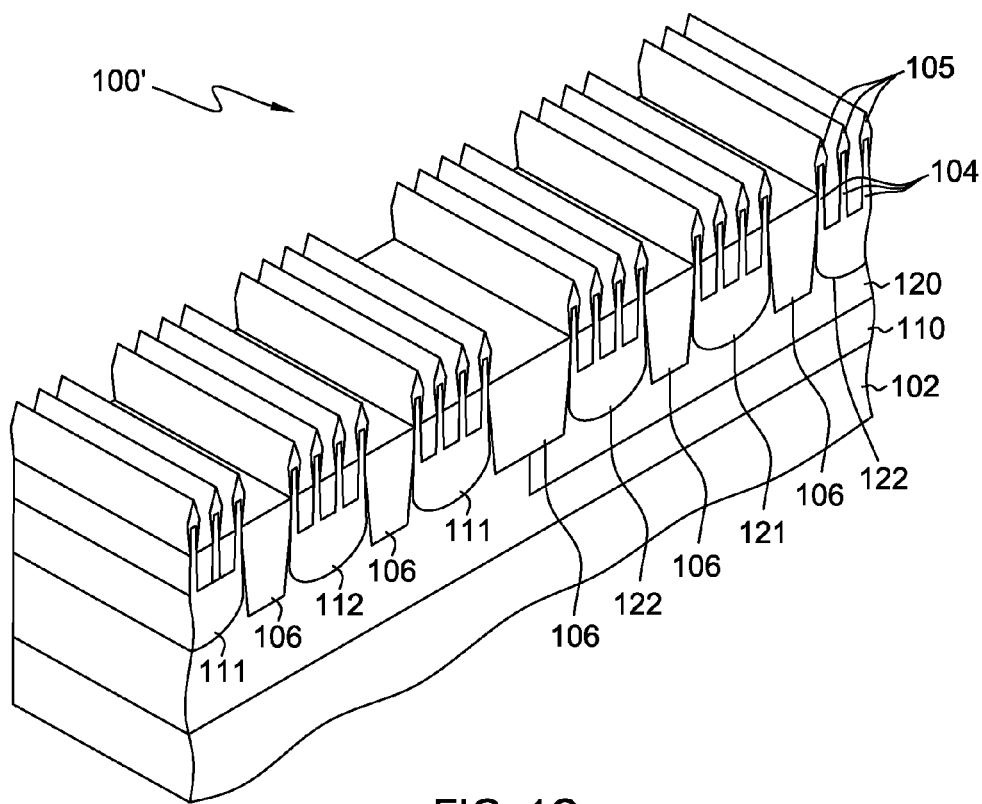
FIG. 1C is an isometric view of another embodiment of a structure including a semiconductor device, in accordance with one or more aspects of the present invention.
Figure 1D:
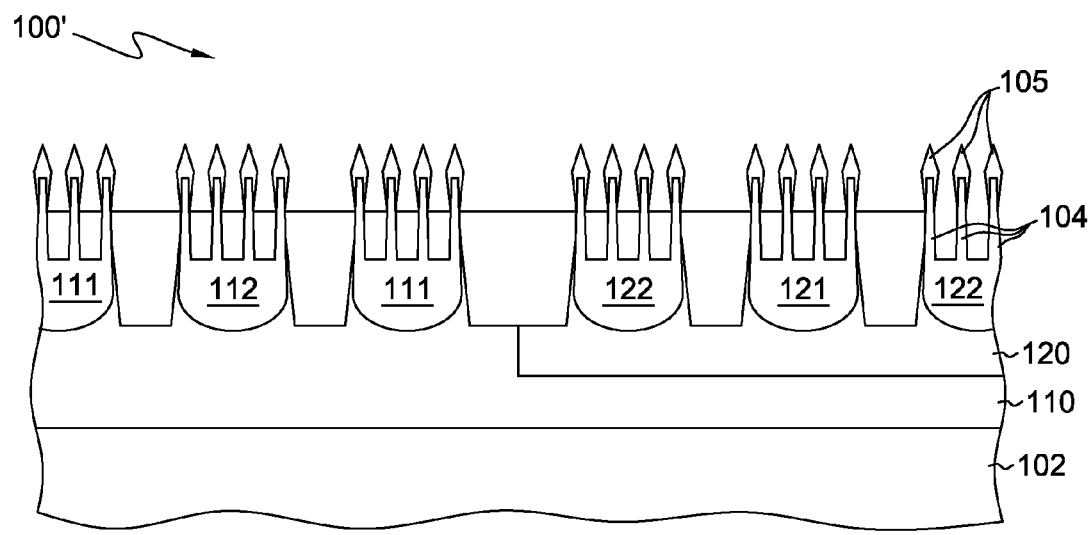

FIG. 1C is an isometric view of another embodiment of a structure 101' including a semiconductor device, and FIG. 1D is a cross-sectional elevational view of structure 101' taken along line 1D-1D of FIG. 1C, in accordance with one or more aspects of the present invention. In the illustrated embodiment, substrate 102 comprises multiple fins 104, and at least one epitaxial contact structure 105 contacts the multiple fins. The multiple fins 104 extend from substrate 102, and may be formed from a uniform flat semiconductor substrate by patterning and etching techniques. For example, substrate 102 may first be patterned using direct lithography, self aligned double patterning, sidewall image transfer, extreme ultraviolet, or any other appropriate patterning technique. After patterning, substrate 102 may be etched using a suitable etching process, such as anisotropic etching, removing portions of the substrate and leaving behind the multiple fins 102. The space between fins may be at least partially filled using an isolation material, such as an oxide, in order to electrically isolate the fins, for example, to prevent leakage currents.

Advantageously, structure 100 is compatible with processing techniques for fabricating complementary metal oxide semiconductor (CMOS) fin field-effect transistors (fin FETs). Fin FETs use the extended fin portions as three-dimensional channels, advantageously providing enhanced performance (for example, increased on current) and low leakage.

Because an integrated circuit design may include both fin FETs in close proximity with other devices, such as the bipolar junction transistors and rectifiers described herein, techniques to allow joint formation over a fin type substrate can allow consolidation of process steps, reducing complexity and cost. For example, it may be simpler to form uniform, substantially parallel fins throughout a substrate, during an early stage of semiconductor fabrication, and then form devices thereafter.

As another example, during fabrication processing, numerous source and drain regions for numerous fin FETs are required, and it may be desirable to epitaxially grow such regions within source and drain cavities formed for that purpose. By using an appropriate mask to block unwanted growth in other regions, source and drain regions may be simultaneously grown across the integrated circuit. The same step of epitaxial growth may also be used to form at least one contact structure 105 across the integrated circuit, facilitating electrical contact to one or more regions of the semiconductor device. In such a manner, a pre-existing processing step may be reused for another purpose, thus consolidating and simplifying fabrication processing. Advantageously, the present technique allows for uniformity of contact height, reducing defects during downstream fabrication processing steps, leading to higher circuit yield and better performance within required tolerances.

FIGS. 1E-1J describe how the universal device structure described herein may be used as multiple different devices, depending on how it is electrically connected and biased during operation. During the semiconductor fabrication process, this universal device structure may be patterned and formed repeatedly on a device layer of one or more integrated circuits. Subsequently formed metallization layers, including metal lines and interconnects to provide electrical connection to devices in the device layer, may be used to electrically connect different instances of the universal device structure in different configurations so that they operate as the different device types as described below.

Figure 1E:
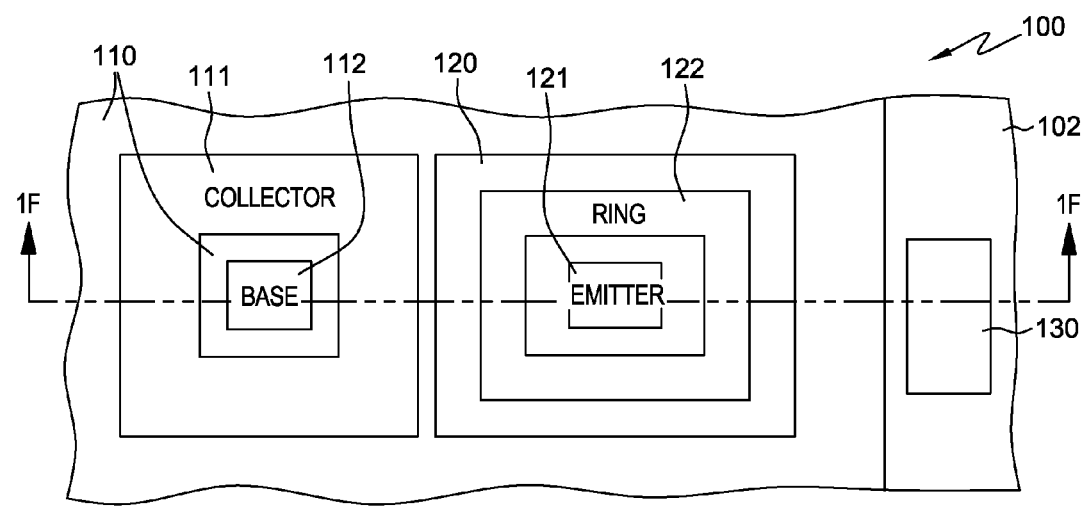
FIG. 1E is a plan view of one embodiment of a bipolar junction transistor, in accordance with one or more aspects of the present invention.
Figure 1F:
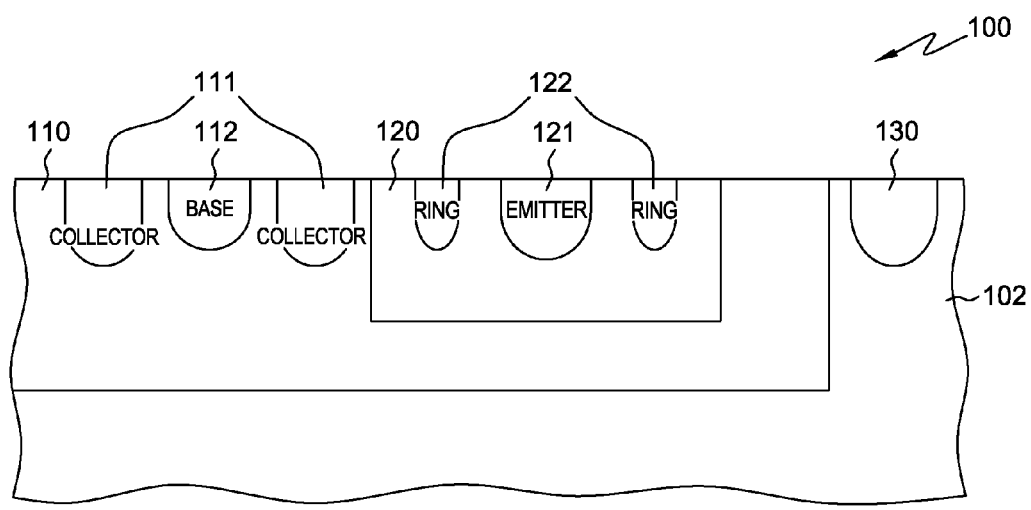
FIG. 1F is a cross-sectional elevational view of the bipolar junction transistor of FIG. 1E, taken along line 1F-1F thereof, in accordance with one or more aspects of the present invention.

FIGS. 1E & 1F are a plan view and a cross-sectional elevational view, respectively, of a PNP bipolar junction transistor, in accordance with one or more aspects of the present invention. A PNP bipolar junction transistor is one type of bipolar junction transistor, which, for example, is in the on-state when the emitter has a higher bias voltage than the base. In the illustrated embodiment, first p-type region 111 is the collector, first n-type region 112 is the base, and second p-type region 121 is the emitter, of the PNP bipolar junction transistor. In such an example, second n-type region 122 is a ring region, and may be electrically connected to the emitter by metallization layers, including metal lines and interconnects. The ring region functions as a noise ring to improve linearity of the device, helps with collecting minority carriers, and allows more effective operations at higher temperatures and voltages. In one example, the collector may be grounded, and emitter may be biased at a higher voltage than the base.

Figure 1G:
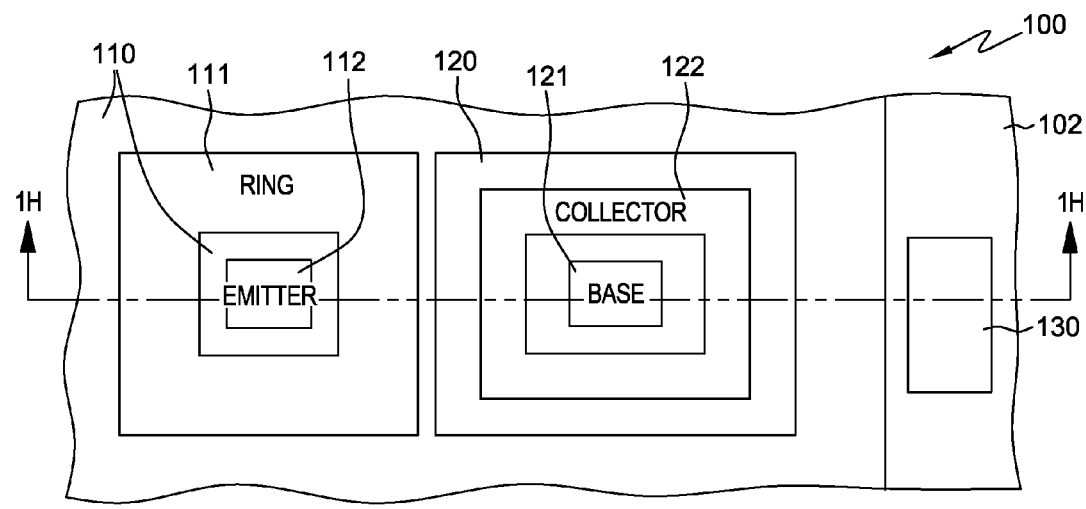
FIG. 1G is a plan view of one embodiment of a bipolar junction transistor, in accordance with one or more aspects of the present invention.
Figure 1H:
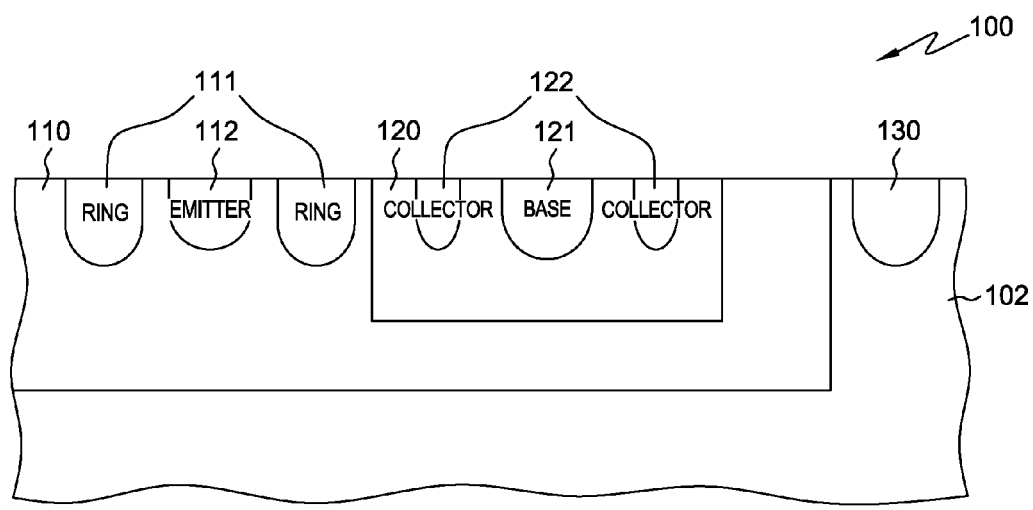
FIG. 1H is a cross-sectional elevational view of the bipolar junction transistor of FIG. 1G, taken along line 1H-1H thereof, in accordance with one or more aspects of the present invention.

FIGS. 1G & 1H are a plan view and a cross-sectional elevational view, respectively, of an NPN bipolar junction transistor, in accordance with one or more aspects of the present invention. An NPN bipolar junction transistor is one type of bipolar junction transistor, which, for example, is in the on-state when the base has a higher bias voltage than the emitter. In the illustrated embodiment, second n-type region 122 is the collector, second p-type region 121 is the base, and first n-type region 112 is the emitter of the NPN bipolar junction transistor. In such an example, first p-type region 111 is a ring region, and may be electrically connected to the emitter.

Figure 1I:
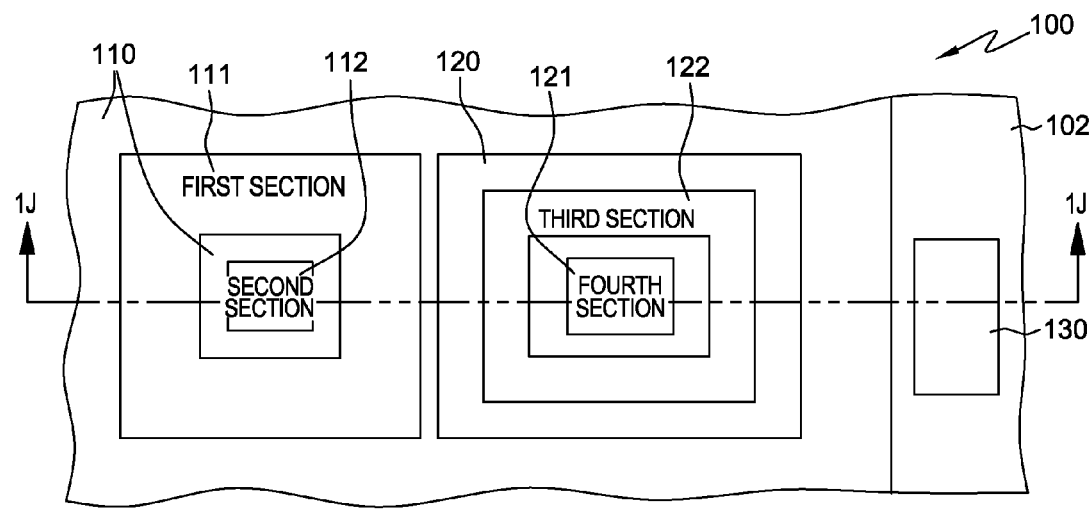
FIG. 1I is a plan view of one embodiment of a semiconductor controlled rectifier, in accordance with one or more aspects of the present invention.
Figure 1J:
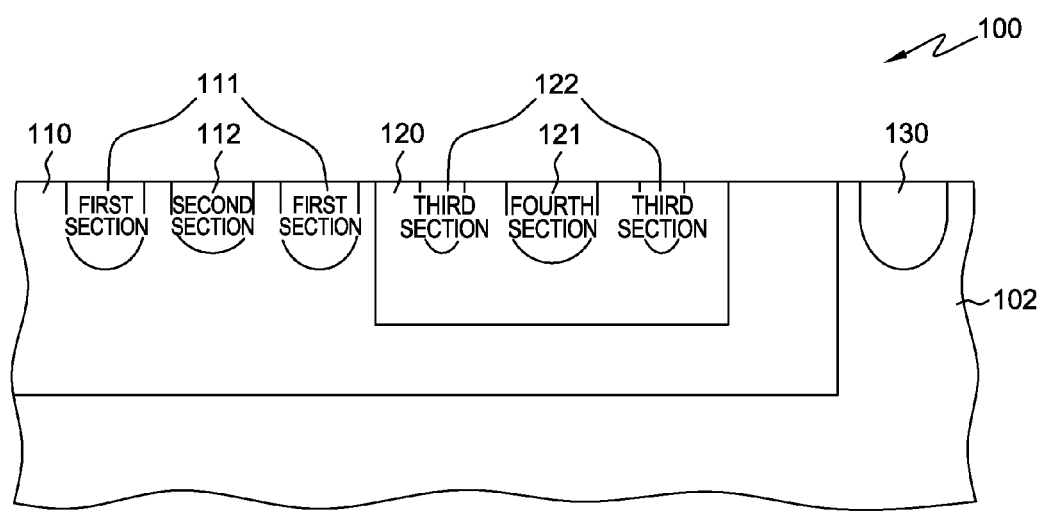
FIG. 1J is a cross-sectional elevational view of the semiconductor controlled rectifier of FIG. 1I, taken along line 1J-1J thereof, in accordance with one or more aspects of the present invention.

FIG. 1I & 1J are a plan view and a cross-sectional elevational view, respectively, of a semiconductor controlled rectifier (SCR), in accordance with one or more aspects of the present invention. In a semiconductor controlled rectifier, also known as a silicon controlled rectifier, in one example, current flows only in one direction, for instance from an first section to a fourth section, upon application of a control voltage. In the illustrated embodiment, first p-type region 111 is the first section, first n-type region 112 is the second section, second n-type region 122 is the third section, and second p-type region 121 is the fourth section of the SCR. An SCR may be used to provide electrostatic discharge (ESD) protection for a CMOS circuit.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A structure comprising:
   a semiconductor device comprising a substrate, the substrate comprising a p-type well adjoining an n-type well, and the semiconductor device comprising:
      a first p-type region and a first n-type region disposed within the n-type well of the substrate, wherein the first p-type region at least partially encircles the first n-type region; and
      a second p-type region and a second n-type region disposed within the p-type well of the substrate, wherein the second n-type region at least partially encircles the second p- type region,
   wherein one of the p-type well or the n-type well of the substrate is located within the other of the p-type well or the n-type well of the substrate, and
   wherein a portion of the n-type well of the substrate extends between first p-type region and the first n-type region, and a portion of the p-type well of the substrate extends between the second p-type region and the second n-type region.

2. The structure of claim 1, wherein the first p-type region fully encircles the first n-type region within the n-type well and the second n-type region fully encircles the second p-type region within the p-type well.

3. The structure of claim 1, wherein the semiconductor device comprises a bipolar junction transistor, the bipolar junction transistor comprising:
   a base region and an emitter region, the base region comprising one of the first n-type region or the second p-type region and the emitter region comprising the other of the first n-type region or the second p-type region; and
   a collector region and a ring region, the collector region comprising one of the first p-type region or the second n-type region and the ring region comprising the other of the first p-type region or the second n-type region.

4. The structure of claim 3, further comprising:
   an electrical contact structure, the electrical contact structure electrically connecting the ring region and the emitter region.

5. The structure of claim 3, wherein the ring region encircles the emitter region.

6. The structure of claim 3, wherein the ring region is configured to facilitate linearity of the bipolar junction transistor.

7. The structure of claim 1, wherein the semiconductor device comprises a semiconductor controlled rectifier, the semiconductor controlled rectifier comprising:
   a first section, the first section comprising the first p-type region;
   a second section, the second section comprising the first n-type region;
   a third section, the third section comprising the second n-type region; and
   a fourth section, the fourth section comprising the second p-type region.

8. The structure of claim 1, wherein the substrate comprises a first semiconductor material, and at least one region of the first p-type region, first n-type region, second p-type region, or second n-type region comprises a second semiconductor material, wherein the first and second semiconductor materials are different semiconductor materials.

9. The structure of claim 8, wherein the first semiconductor material comprises silicon and the second semiconductor material comprises silicon germanium, and wherein the second semiconductor material of the at least one region is in at least partial crystal alignment with the first semiconductor material of the first substrate.

10. The structure of claim 1, wherein the substrate comprises multiple fins, and at least one region of the first p-type region, first n-type region, second p-type region, or second n-type region comprises one or more fins of the multiple fins of the substrate.

11. The structure of claim 10, further comprising at least one epitaxial contact structure, the at least one epitaxial contact structure contacting the one or more fins of the at least one region.

12. The structure of claim 1, further comprising a p-type substrate contact region, wherein the p-type substrate contact region is spaced apart from both the p-type well and the n-type well, and electrically contacts the substrate.

13. A method comprising:
   providing a semiconductor device comprising a substrate, the substrate comprising a p-type well adjoining an n-type well, and the providing comprising:
      fabricating a first p-type region and a first n-type region disposed within the n-type well of the substrate, and a second p-type region and a second n-type region disposed within the p-type well of the substrate, wherein the first p-type region at least partially encircles the first n-type region, and the second n-type region at least partially encircles the second p-type region,
      forming one well of the p-type well or the n-type well within the substrate; and
      forming the other well of the p-type well or the n-type well within the one well,
   wherein a portion of the n-type well of the substrate extends between first p-type region and the first n-type region, and a portion of the p-type well of the substrate extends between the second p-type region and the second n-type region.

14. The method of claim 13, wherein the fabricating further comprises forming the first p-type region to fully encircle the first n-type region within the n-type well and the second n-type region to fully encircle the second p-type region within the p-type well.

15. The method of claim 13, wherein the substrate comprises a first semiconductor material, and the fabricating comprises:
   forming at least one region of the first p-type region, first n-type region, second p-type region, or second n-type region with a second semiconductor material, wherein the first and second semiconductor materials are different semiconductor materials.

16. The method of claim 15, wherein the forming comprises:
   providing at least one cavity in the substrate; and
   epitaxially growing the second semiconductor material from one or more surfaces of the at least one cavity to form the at least one region.

17. The method of claim 13, further comprising forming, before the fabricating, multiple fins extending from the substrate, wherein the fabricating comprises fabricating at least one region of the first p-type region, first n-type region, second p-type region, or second n-type region to comprise one or more fins of the multiple fins of the substrate.

18. The structure of claim 1, wherein the first n-type region is disposed directly within the n-type well of the substrate, and wherein the second p-type region is disposed directly within the p-type well of the substrate.

19. The structure of claim 1, wherein the first p-type region and the first n-type region are spaced from one another, and wherein the second p-type region and the second n-type region are spaced from one another.

\* \* \* \* \*